United States Patent
Sheena et al.

(10) Patent No.: US 10,191,084 B1
(45) Date of Patent: Jan. 29, 2019

(54) PROGRAMMABLE SELF-ADJUSTING RESISTANCE SOURCE

(71) Applicant: IET Labs, Inc., West Roxbury, MA (US)

(72) Inventors: Benjamin Salim Sheena, Brooklyn, NY (US); Robert Michael Brown, Worcester, MA (US); Trung Q. Mai, Milton, MA (US); David Sheena, Brookline, MA (US)

(73) Assignee: IET Labs, Inc., West Roxbury, MA (US)

( * ) Notice: Subject to any disclaimer, the term of this patent is extended or adjusted under 35 U.S.C. 154(b) by 0 days.

(21) Appl. No.: 15/850,919

(22) Filed: Dec. 21, 2017

(51) Int. Cl.
| | |
|---|---|
| *H01C 13/02* | (2006.01) |
| *G01R 1/20* | (2006.01) |
| *H01C 10/16* | (2006.01) |
| *G01R 17/10* | (2006.01) |
| *H01C 1/02* | (2006.01) |

(52) U.S. Cl.
CPC ........... *G01R 1/203* (2013.01); *G01R 17/105* (2013.01); *H01C 10/16* (2013.01); *H01C 13/02* (2013.01); *H01C 1/02* (2013.01)

(58) Field of Classification Search
CPC ...... G01R 17/105; G01R 1/203; H01C 10/16; H01C 13/02; H01C 1/02
USPC ........................................................ 338/227
See application file for complete search history.

(56) References Cited

U.S. PATENT DOCUMENTS

| | | | |
|---|---|---|---|
| 4,157,494 A | 6/1979 | Kornienko et al. | |
| 4,227,172 A | 10/1980 | Sherman | |
| 4,849,903 A | 7/1989 | Fletcher et al. | |
| 5,045,832 A * | 9/1991 | Tam ...................... | H03M 1/662 257/536 |

(Continued)

OTHER PUBLICATIONS

Meatest, "M642: Programmable Resistance Decade," downloaded from <https://www.meatest.com/files/download/dat/m642d.pdf> on Feb. 26, 2018, 2 pages.

(Continued)

*Primary Examiner* — Kyung S Lee
(74) *Attorney, Agent, or Firm* — BainwoodHuang; M. Ari Behar

(57) ABSTRACT

Embodiments are directed to techniques for providing a user-selected target resistance across a set of output terminals of a resistance-generating apparatus. The techniques include (a) assigning a first arrangement of resistance circuitry of the resistance-generating apparatus that nominally provides the target resistance based on known resistance values of a plurality of resistors of the resistance circuitry, (b) configuring the resistance circuitry according to the assigned first arrangement, thereby providing a first resistance across output terminals, (c) subsequently, receiving a resistance measurement from a measurement device configured to measure the first resistance, (d) in response to receiving the resistance measurement, assigning a second arrangement of the resistance circuitry based on a difference between the target resistance and the resistance measurement, and (e) configuring the resistance circuitry according to the assigned second arrangement, thereby providing a second resistance, the second resistance being closer to the target resistance than was the first resistance. Systems and apparatuses are also provided.

20 Claims, 3 Drawing Sheets

(56) References Cited

U.S. PATENT DOCUMENTS

| | | | |
|---|---|---|---|
| 5,248,956 A | 9/1993 | Himes et al. | |
| 6,331,768 B1 * | 12/2001 | Drori | H03H 7/24 |
| | | | 323/297 |
| 6,487,456 B1 | 11/2002 | Masano et al. | |
| 6,744,244 B2 * | 6/2004 | Liu | H03G 1/0088 |
| | | | 323/297 |
| 7,321,255 B2 * | 1/2008 | Maki | G09G 3/3655 |
| | | | 323/313 |
| 7,339,362 B2 * | 3/2008 | Kuo | G11C 5/14 |
| | | | 323/353 |
| 7,619,502 B2 * | 11/2009 | Prabhakaran | H03H 7/24 |
| | | | 323/297 |
| 7,889,048 B2 * | 2/2011 | Owen | G06F 17/5036 |
| | | | 323/354 |
| 8,368,672 B2 * | 2/2013 | Morita | G09G 3/3666 |
| | | | 345/100 |
| 8,810,354 B2 | 8/2014 | Govindasamy et al. | |
| 2015/0130501 A1 | 5/2015 | Dong | |

OTHER PUBLICATIONS

Meatest, "M642 Programmable Resistance Decade: Operation manual," downloaded from <https://www.meatest.com/files/download/man/m642m.pdf> on Feb. 26, 2018, 70 pages.

Meatest, "M600 Series: Programmable Resistance Decades and RTD Simulators," downloaded from <https://www.meatest.com/files/download/ext/m6xxs.pdf> on Feb. 26, 2018, 13 pages.

Northrup, Edwin F., "Resistance Set," U.S. Pat. No. 731,209, issued Jun. 16, 1903.

\* cited by examiner

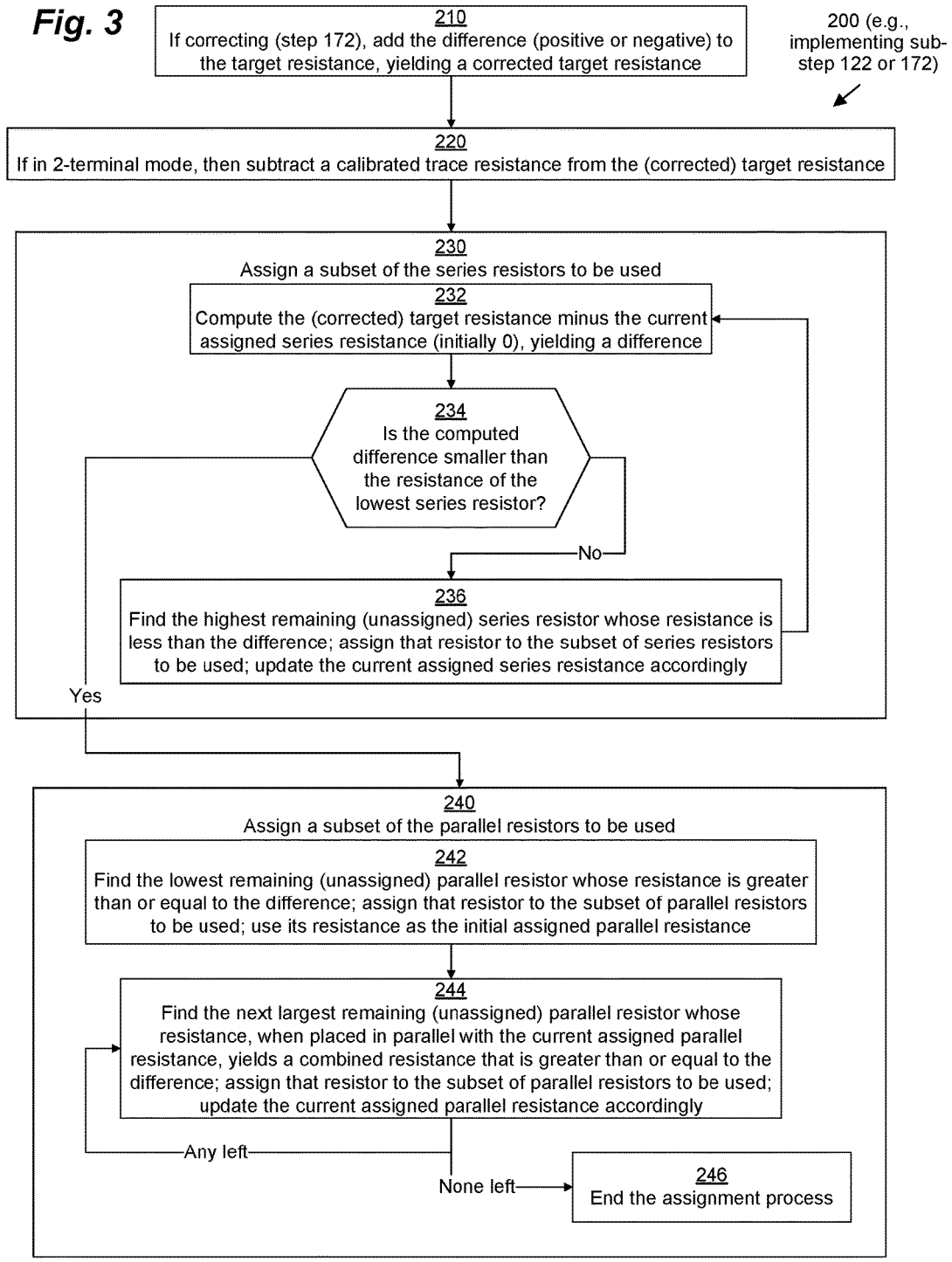

PROGRAMMABLE SELF-ADJUSTING RESISTANCE SOURCE

BACKGROUND

Engineers and technicians often have a need to generate various electrical resistances to produce a load or test on an electronic device. This may be accomplished by using a potentiometer or a rheostat. However, in order to operate across a wider range of resistances with more accuracy, it has long been known to use a decade resistance box, in which sets (or "decades") of resistors are placed in series with each other and independently controlled to allow a wide range of resistances to be precisely provided. Each decade of resistors is able to generate integer multiples of $10^x$ from 0 through 9 or 10, each decade being associated with a different power x. Thus, for example, U.S. Pat. No. 731,209 (Northrup) describes a decade resistance box with five decades (values of x ranging from −1 through 3), each decade having four resistors in series (with resistance values of $10^x$, $3(10^x)$, $3(10^x)$, and $2(10^x)$), allowing the user to generate any resistance ranging from 0.1Ω to 9,999.9Ω with a resolution of 0.1Ω by rotating mechanical dials representing the different powers of 10 places. U.S. Pat. No. 4,227,172 describes decades that are made up of four resistors that may be dynamically arranged either in series or parallel or both, also allowing for easy multiplication of a resistance by factors of 10.

Various improved decade boxes utilize electrical switching using transistors, such as, for example, U.S. Pat. Nos. 4,157,494, 4,849,903, and 8,810,354. U.S. Pat. No. 6,487,456 (Masano, et al.) describes a digital input interface used in connection with a microprocessor that allows the resistance of each individual resistor to be calibrated. Masano also teaches using relays to select resistors.

SUMMARY

Unfortunately, conventional decade boxes suffer from deficiencies. Although a wide range of resistances may be generated, only the higher resistances may be selected with precision (e.g., the high resistance of Northrup, 9,999.9Ω, has five digits of precision, but the low resistance, 0.1Ω, has only one digit of precision). In addition, although a conventional decade box may be calibrated for high accuracy, such calibration is a tedious process. One could design a resistance generator that operates over a wide range with high precision by using a number of parallel-arranged resistors over a wide resistance range that may be combined in various combinations. However, drift in these resistors may cause such a resistance generator to lose accuracy over time.

Thus, it would be desirable to implement a resistance box having a high degree of precision (i.e., at least 6 digits) across an entire wide operable range (e.g., ranging from 0.100 000Ω to 20.000 000 MΩ) with extremely-high accuracy, such as, for example, 5 parts per million (ppm). This may be accomplished through the use of both serially-arranged and parallel-arranged resistors that may be dynamically controlled by a computerized device to select a best combination of resistors to generate a user-input resistance (input using a 6.5 or 7.5 digit interface). Accuracy is ensured by a constant connection to a digital multimeter (or other high accuracy resistance measurement device) that allows the selection of resistors to be iteratively altered based on live resistance calibration.

In one embodiment, an apparatus is provided. The apparatus includes (a) resistance circuitry having a plurality of resistors in a dynamically-configurable arrangement, (b) a user interface including input circuitry, (c) a set of output terminals configured to provide an electrical signal to a measurement device, (d) a communications port configured to communicate with the measurement device, and (e) control circuitry. The control circuitry is constructed and arranged to (1) receive a target resistance from a user via the input circuitry, (2) assign a first arrangement of the resistance circuitry that nominally provides the target resistance based on known resistance values of the plurality of resistors, (3) configure the resistance circuitry according to the assigned first arrangement, thereby providing a first resistance across the set of output terminals, (4) subsequently, receive a resistance measurement from the measurement device via the communications port, (5) in response to receiving the resistance measurement, assign a second arrangement of the resistance circuitry based on a difference between the target resistance and the resistance measurement, and (6) configure the resistance circuitry according to the assigned second arrangement, thereby providing a second resistance across the set of output terminals, the second resistance being closer to the target resistance than was the first resistance. In some embodiments, additional iterations may be performed. Systems, methods, and computer program products for achieving similar results are also provided.

The foregoing summary is presented for illustrative purposes to assist the reader in readily grasping example features presented herein. However, the foregoing summary is not intended to set forth required elements or to limit embodiments hereof in any way.

BRIEF DESCRIPTION OF THE SEVERAL VIEWS OF THE DRAWINGS

The foregoing and other features and advantages will be apparent from the following description of particular embodiments of the invention, as illustrated in the accompanying drawings, in which like reference characters refer to the same or similar parts throughout the different views.

FIG. 3 is a flowchart depicting example methods of various embodiments for selecting particular resistors to achieve a desired output resistance.

DETAILED DESCRIPTION OF THE INVENTION

Embodiments are directed to techniques for implementing a resistance box having a high degree of precision (i.e., at least 6 digits) across an entire wide operable range (e.g., ranging from 0.100 000Ω to 20.000 000 MΩ) with extremely-high accuracy, such as, for example, 5 parts per million (ppm). This may be accomplished through the use of both serially-arranged and parallel-arranged resistors that may be dynamically controlled by a computerized device to select a best combination of resistors to generate a user-input resistance (input using a 6.5 or 7.5 digit interface). Accuracy is ensured by a constant connection to a digital multimeter (or other high accuracy resistance measurement device) that allows the selection of resistors to be iteratively altered based on live resistance calibration.

Figure 1:
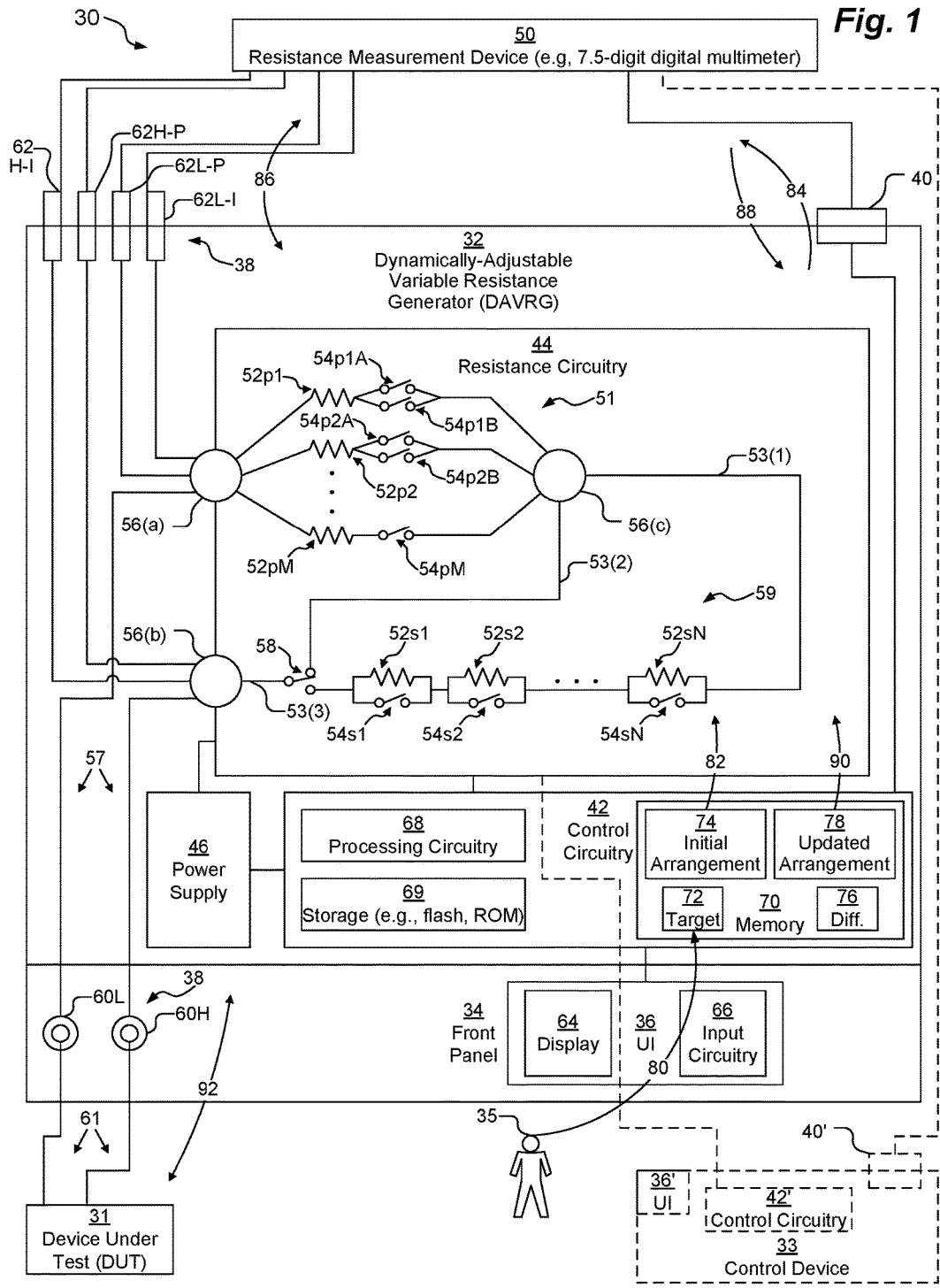
FIG. 1 is a block/schematic diagram depicting an example system and apparatus for use in connection with various embodiments.

FIG. 1 depicts an example system 30 including a dynamically-adjustable variable resistance generator (DAVRG) 32 that connects to a resistance measurement device 50 and a Device under Test (DUT) 31. In some embodiments, a separate control device 33 is also used. System 30 also includes user interface (UI) means, such as, for example, UI 36 or 36'. A user 35 controls the DAVRG 32 via the UI means, allowing the DAVRG 32 to dynamically generate a target resistance 72 input by the user with a high degree of precision and accuracy so that the DUT 31 can be accurately tested, repaired, or calibrated. System 30 also includes resistance circuitry 44 (part of DAVRG 32) and control means for controlling the resistance circuitry 44.

DUT 31 may be any electronic device that the user 35 wishes to test, repair, or calibrate using a specific resistance. For example, DUT 31 may be an ohmmeter, a multimeter, a circuit needing to be set with a variable resistance, or a system requiring a Resistance Temperature Device (RTD) input.

Resistance measurement device 50 may be any device capable of accurately and precisely measuring resistance. Resistance measurement device 50 is typically precise to at least 6.5 digits, although, in some arrangements, 7.5 digits, 8.5 digits, or even higher precision may be used. Example resistance measurement devices 50 include the widely-available Fluke 8508A and Keysight 3458A digital multimeters. Resistance measurement device 50 may have two or four terminals, allowing for either standard or Kelvin connections to the DAVRG 32. The use of 4-terminal Kelvin connections allows for more accuracy, particularly when measuring low resistance values, by reducing contact lead effects.

DAVRG 32 includes a set of output terminals 38, a communications port 40, the resistance circuitry 44, and a power supply 46. In a typical embodiment DAVRG 32 also includes control circuitry 42, embodying the control means, and a UI 36 mounted on a front panel 34, embodying the UI means. In this typical embodiment, communications port 40 interfaces with the resistance measurement device 50. However, in an alternate embodiment (depicted using dashed lines), instead of UI 36 being mounted on front panel 34 of the DAVRG 32, the user 35 uses UI 36' of separate control device 33 which includes control circuitry 42' (which embodies the control means in this embodiment rather than control circuitry 42 mounted in the DAVRG 32). In this alternate embodiment, control device 33 has its own communications port 40' for interfacing with the resistance measurement device 50, and communications port 40 of the DAVRG 32 may instead be used to connect the DAVRG 32 to the control device 33.

Control device 33 may be any kind of computing device, such as, for example, a personal computer, workstation, server computer, enterprise server, DSS rack server, laptop computer, tablet computes, smart phone, mobile computer, etc. Control device 33 may instead be a special-purpose hardware device hard-wired to interface with a user 35 and control a DAVRG 32. In an example, computing device 33 is a personal computer running management software, with external monitor, keyboard, and mouse serving as UI 36'.

Communications port 40, 40' may be any type of port configured to receive a jack of a cable that allows for communication of data between devices 32, 33, 50, such as, for example, an IEEE-488 parallel port, an RS-232 serial port, a USB port, or an IEEE 1394 serial port.

UI 36 (or 36') may take various forms, but, in general, UI 36 includes a display 64 as well as input circuitry 66. In some embodiments, input circuitry 66 may be integrated into the display 64 (e.g., a touchscreen). Display 64 may include, for example, an LCD screen mounted directly onto the front panel 34. Input circuitry 66 may include, for example, a keypad mounted directly onto the front panel 34 and/or a dynamic touchpad displayed on display 64.

Control circuitry 42 includes processing circuitry 68 and memory 70. In some embodiments, control circuitry 42 also includes storage 69, such as, for example, flash memory, read-only memory (ROM), programmable ROM, etc., that stores executable code of firmware (or, in some embodiments, software) configured to control operation of DAVRG 32.

Processing circuitry 68 may be any kind of processor or set of processors configured to perform operations, such as, for example, a microprocessor, a multi-core microprocessor, a digital signal processor, a system on a chip, a collection of electronic circuits hard-wired to perform operations of a method to control operation of DAVRG 32, a similar kind of controller, or any combination of the above. In some embodiments, processing circuitry 68 is configured to load and execute the firmware from storage 69. Storage 69 is configured to store programs and data even while the DAVRG 32 is powered off.

Memory 70 may be any kind of digital system memory, such as, for example, dynamic random access memory (DRAM). In some embodiments, memory 70 stores the firmware from storage 69 after being loaded by processing circuitry 68. Memory 70 stores various data structures and variables, such as, for example, the target resistance 72 received from the user 35, an initial arrangement 74 of resistance circuitry 44, an updated arrangement 78 of resistance circuitry 44, and a difference 76 between a resistance value measured by the resistance measurement device 50 and the target resistance 72.

Computer firmware or software, when stored in non-transient form either in storage 69 or memory 70 forms a computer program product. The processing circuitry 68 running computer firmware or software thus forms a specialized circuit constructed and arranged to carry out the various processes described herein.

Control circuitry 42' may have a structure similar to control circuitry 42.

Output terminals 38 may include front-mounted device terminals 60 as well as rear-mounted calibration terminals 62. Front-mounted device terminals 60 connect to DUT 31 over cables 61. In some embodiments, as depicted, there are two front-mounted device terminals 60L, 60H, which enable a 2-terminal connection to the DUT 31. In other embodiments (not depicted), there may instead be four front-mounted device terminals 60 to allow either a 2-terminal connection or a Kelvin connection to the DUT 31. Output terminals 38 connect to resistance circuitry 44 over low-resistance traces 57.

Rear-mounted calibration terminals 62 connect to resistance measurement device 50 over cables. In some embodiments, as depicted, there are four rear-mounted calibration terminals 62H-I, 62H-P, 62L-P, 62L-I to allow either a 2-terminal connection or a Kelvin connection to the resistance measurement device 50, although, in such embodiments, a Kelvin connection is typically used if low resistances are needed. In other embodiments (not depicted), there may instead be only two rear-mounted calibration terminals 62H-I, 62L-I.

Resistance circuitry 44 includes resistors 52 and control switches 54 configured to selectively allow current to pass through the various resistors 52 in accordance with an arrangement 74, 78. A parallel set 51 of resistors 52$p$ (depicted as parallel resistors 52$p$1, 52$p$2, . . . , 52$p$M) are arranged in parallel with each other, while a series set 59 of resistors 52$s$ (depicted as series resistors 52$s$1, 52$s$2, . . . , 52$s$N) are arranged in series with each other. Thus, as depicted, there are M parallel resistors 52$p$, and there are N series resistors 52$s$. Typically, resistors 52 are chosen to be very stable, such that the respective resistances of these resistors 52 do not drift significantly over time and such that the respective resistances of these resistors 52 change only very minimally based on temperature.

Each parallel resistor 52$p$ of the parallel set 51 has a respective resistance. Thus, parallel resistor 52$p$1 has resistance Rp1 (not depicted), parallel resistor 52$p$2 has resistance Rp2 (not depicted), and parallel resistor 52$p$M has resistance RpM (not depicted). As depicted, these parallel resistance values Rp increase from lower to higher resistance, each, for example, increasing by close to a factor of two. Thus, in one example embodiment, the resistance Rp1 of parallel resistor 52$p$1 is 0.17Ω, the resistance Rp2 of parallel resistor 52$p$2 is 0.35Ω, and the resistance RpM of parallel resistor 52$p$M is 120 MΩ. In this example, M=31, so there are 31 parallel resistors 52$p$1-52$p$31. Example resistances Rp1-Rp31 for these resistors 52$p$1-52$p$31 are depicted in Table 1.

TABLE 1

Example Parallel resistance values

| | | | | | |
|---|---|---|---|---|---|
| Rp1 | 0.17 Ω | Rp12 | 287.0 Ω | Rp23 | 506.0 kΩ |
| Rp2 | 0.35 Ω | Rp13 | 570.0 Ω | Rp24 | 1.0 MΩ |
| Rp3 | 0.7 Ω | Rp14 | 1.13 kΩ | Rp25 | 2.0 MΩ |
| Rp4 | 1.37 Ω | Rp15 | 2.23 kΩ | Rp26 | 3.99 MΩ |
| Rp5 | 2.66 Ω | Rp16 | 4.4 kΩ | Rp27 | 7.8 MΩ |
| Rp6 | 5.15 Ω | Rp17 | 8.7 kΩ | Rp28 | 15.0 MΩ |
| Rp7 | 10.2 Ω | Rp18 | 17.0 kΩ | Rp29 | 30.0 MΩ |
| Rp8 | 20.0 Ω | Rp19 | 33.3 kΩ | Rp30 | 60.0 MΩ |
| Rp9 | 38.8 Ω | Rp20 | 66.0 kΩ | Rp31 | 120.0 MΩ |
| Rp10 | 75.6 Ω | Rp21 | 130.0 kΩ | | |
| Rp11 | 148.0 Ω | Rp22 | 258.0 kΩ | | |

It should be noted that these precise resistance values may vary. Variation from these values by up to 100 ppm will also yield acceptable results, provided that the exact resistance values are known.

Each series resistor 52$s$ of the series set 59 also has a respective resistance. Thus, series resistor 52$s$1 has resistance Rs1 (not depicted), series resistor 52$p$2 has resistance Rs2 (not depicted), and series resistor 52$s$N has resistance RsN (not depicted). As depicted, these series resistance values Rs increase from lower to higher resistance, each, for example, increasing by close to a factor of two. Thus, in one example embodiment, the resistance Rs1 of series resistor 52$s$1 is 3.55 kΩ, the resistance Rs2 of series resistor 52$s$2 is 7.39 kΩ, and the resistance RsN of series resistor 52$s$N is 10.0 MΩ. In this example, N=12, so there are 12 parallel resistors 52$s$1-52$s$12. Example resistances Rs1-Rs12 for these resistors 52$s$1-52$s$12 are depicted in Table 2. It should be noted that these precise resistance values may vary. Variation from these values by up to 100 ppm will also yield acceptable results, provided that the exact resistance values are known.

TABLE 2

| Example Series resistance values | |
|---|---|
| Rs1 | 3.55 kΩ |
| Rs2 | 7.39 kΩ |
| Rs3 | 16.4 kΩ |
| Rs4 | 33.8 kΩ |
| Rs5 | 72.2 kΩ |
| Rs6 | 147.0 kΩ |
| Rs7 | 300.0 kΩ |
| Rs8 | 600.0 kΩ |
| Rs9 | 1.23 MΩ |
| Rs10 | 2.48 MΩ |
| Rs11 | 5.0 MΩ |
| Rs12 | 10.0 MΩ |

It is also possible to use series and parallel resistance values RS, Rp that are entirely different than the values provided in Tables 1 and 2, provided that the resistance values are capable of generating all resistance values within the operable range to within an acceptable accuracy (e.g., 5 ppm or 50 ppm). In order to do this, it is desirable to have several parallel resistors 52$p$ having very high resistance values Rp. For example, in order to provide an accuracy of 5 ppm and 7.5 digits of precision for resistance values across the range of 0.100 000Ω to 20.000 000 MΩ, it is desirable for at least two of the parallel resistors 52$p$ to have resistance values Rp exceeding 20 MΩ.

Current within resistance circuitry 44, as depicted, may run from low connector 56($a$) to high connector 56($b$) by traversing parallel set 51, bypass trace 53(2), switch 58, and trace 53(3). Or, in the event that bypass switch 58 is changed to the other position, current within resistance circuitry 44 would instead run from low connector 56($a$) to high connector 56($b$) by traversing parallel set 51, trace 53(1), series set 59, bypass switch 58, and trace 53(3). Thus, bypass switch 58 (e.g., a relay, transistor, or other solid state switching device) and bypass trace 52(2) is used in some embodiments to allow the series set 59 to be bypassed. In other embodiments, bypass switch 58 and bypass trace 52(2) may be omitted, forcing current to traverse both resistance sets 51, 59. The use of bypass switch 58 minimizes additional series resistance due to multiple unused relay contacts within series set 59.

Functional use of each parallel resistor 52$p$ is controlled by one or more associated control switches 54$p$. As depicted, at least one control switch 54$p$ must be closed to allow at least some current to pass across parallel set 51.

Switches 54$p$ are electrically-controllable and may be of various types, but, in several embodiments, each switch 54$p$ is a relay. In other embodiments, one or more of the switches 54$p$ may instead be transistors or other solid state devices. In some embodiments, one or more of the switches 54$p$ may be a multi-pole relay, such as, for example, a Panasonic S4EB 4-pole relay, to ensure optimal contact and low resistance while closed.

In some embodiments, one or more of the parallel resistors 52$p$ are controlled by two or more (e.g., four) relays arranged in parallel. Thus, as depicted, parallel resistor 52$p$1 is controlled by relays 54$p$1A and 54$p$1B, and parallel resistor 52$p$2 is controlled by relays 54$p$2A and 54$p$2B. In one example, embodiment, four parallel 4-pole relays are used for the lowest-resistance parallel resistors 52$p$ for a total of sixteen points of contact for extremely low contact resistance. In the example of Table 1, parallel resistors 52$p$1 through 52$p$10 may each be controlled by four parallel 4-pole relays, parallel resistor 52$p$11 may be controlled by two parallel 4-pole relays, and each of the remaining parallel resistors 52p12-52p31 may be controlled by a single relay.

Functional use of each series resistor 52s is controlled by a respective control switch 54s placed in parallel with each series resistor 52s. Thus, if switch 54s1 is closed, current passes across switch 54s1 with very low resistance, effectively eliminating any contribution from the resistance of series resistor 52s1, but, if switch 54s1 is open, current passes across series resistor 52s1, allowing a series contribution of resistance Rs1 to the combined resistance of series set 59. If switches 54s1 and 54sN are both open, but all the other series switches 54s2 through 54s(N−1) are closed, then the total resistance across series set 59 will be Rs1+RsN (in the example of Table 2, 3.55 kΩ+10 MΩ=10,003,550Ω). However, since the total series resistance of all the series switches 54s may sum up to a non-trivial value (especially when combined with a very low resistance within parallel set 51), if all of the series switches 54s are closed, then, in some embodiments, bypass switch 58 is switched to entirely bypass series set 59, allowing the resistance generated by parallel set 51 (plus trace resistances of traces 53(2), 53(3) and switch 58) to dominate the total resistance of the resistance circuitry 44 without errors attributed to any incomplete closures of the series switches 54s.

Switches 54s are electrically-controllable and may be of various types, but, in several embodiments, each switch 54s is a relay. In other embodiments, one or more of the switches 54s may instead be transistors or other solid state devices. In some embodiments, one or more of the switches 54s may be a multi-pole relay, such as, for example, a Panasonic S4EB 4-pole relay, to ensure optimal contact and low resistance while closed.

In some embodiments, connections 56(a) and 56(c) (and connection 56(b), as depicted) are star connectors, since these connections 56(a), 56(b) each connect to a multitude of traces. This arrangement allows for the various traces to have independent resistance contributions to the circuit resistance, eliminating errors within calculations when more than one resistor 52p is placed in parallel.

Various traces (e.g., traces 53(1), 53(2), 53(3), 57) as well as cables 61 may also contribute trace resistance to the resistance output by DAVRG 32 across output terminals 38. However, if a Kelvin connection is used, the effect of many of these trace resistances can be eliminated. If a Kelvin connection is not used, then a total trace resistance due to traces 53(2), 53(3), 57 and bypass switch 58 may be measured and used as a correction to the target resistance 72. This is particularly important when only the lowest-valued parallel resistors 52p (e.g., 52p1-52p8) are used.

In example operation, user 35 performs an input operation 80 using UI means (e.g., 36, 36') to input the target resistance 72 into memory 70 of control means (e.g., 42, 42'). Henceforth, the example operation will only be presented in connection with an embodiment in which a separate control device 33 is not used.

Next, control circuitry 42 determines an initial arrangement 74 of the resistors 52 and/or switches 54 of resistance circuitry that is expected to provide the target resistance 72 across output terminals 38 based on pre-stored specifications of the resistance values of the various resistors 52 (taking known trace resistances into account, as needed). In some embodiments, the DAVRG 32 may be factory-calibrated (or calibrated periodically by a technician) to adjust for drift in the resistance values of the various resistors 52. Thus, for example, even though the resistance Rp2 of resistor 52p2 is specified to be 0.35Ω, at calibration time, the technician may record (e.g., using resistance measuring device 50 or another resistance measuring device having high accuracy) that the measured resistance of resistor 52p2 between connectors 56(a), 56(c) (taking trace resistance into account, but also allowing for drift) is actually 0.349 975 2Ω. At that point, the technician would make sure that the calibrated value of Rp2 (which may be stored in storage 69) is updated to be 0.349 975 2Ω.

Then, control circuitry 42 sends an instruction 82 to the resistance circuitry 44 to become configured in accordance with the initial arrangement 74. For example, instruction 82 may include a bitmap with each bit addressing a respective control switch 54 of resistance circuitry, indicating whether that switch 54 should be open or closed. In the example presented above in connection with tables 1 and 2, since there are 31+12=43 resistors, the bitmap may be 43 bits long. In some embodiments, an additional bit is used to address the bypass switch 58. In some embodiments, the bitmap may include additional bits to control various other relays (e.g., relays, not depicted, that switch between the front terminals 60 and the rear terminals 62) or settings of the resistance circuitry 44.

Upon resistance circuitry 44 becoming configured in accordance with the instruction 82, control circuitry 42 sends a measurement command 84 across communications port 40 to the resistance measurement device 50, directing the resistance measurement device 50 to measure the resistance across rear terminals 62. Resistance measurement device 50 then performs the resistance measurement 86 and sends the recorded resistance measurement 88 back across communications port 40 to the control circuitry 42. Control circuitry 42 then determines the difference 76 between the target resistance 72 and the recorded resistance measurement 88. If the difference 76 is not within an acceptable tolerance (e.g., 5 ppm or 50 ppm), then control circuitry 42 uses the difference 76 to determine an updated arrangement 78 that it then sends to the resistance circuitry 44 in updated instruction 90. This process may be repeated several times until an acceptable tolerance is reached (or until a maximum number of iterations, e.g., five, is performed). At that point, control circuitry 42 may direct the resistance circuitry 44 to switch to outputting its resistance across the front terminals 60, to allow the generated resistance to be used in connection with the DUT 61.

Figure 2:
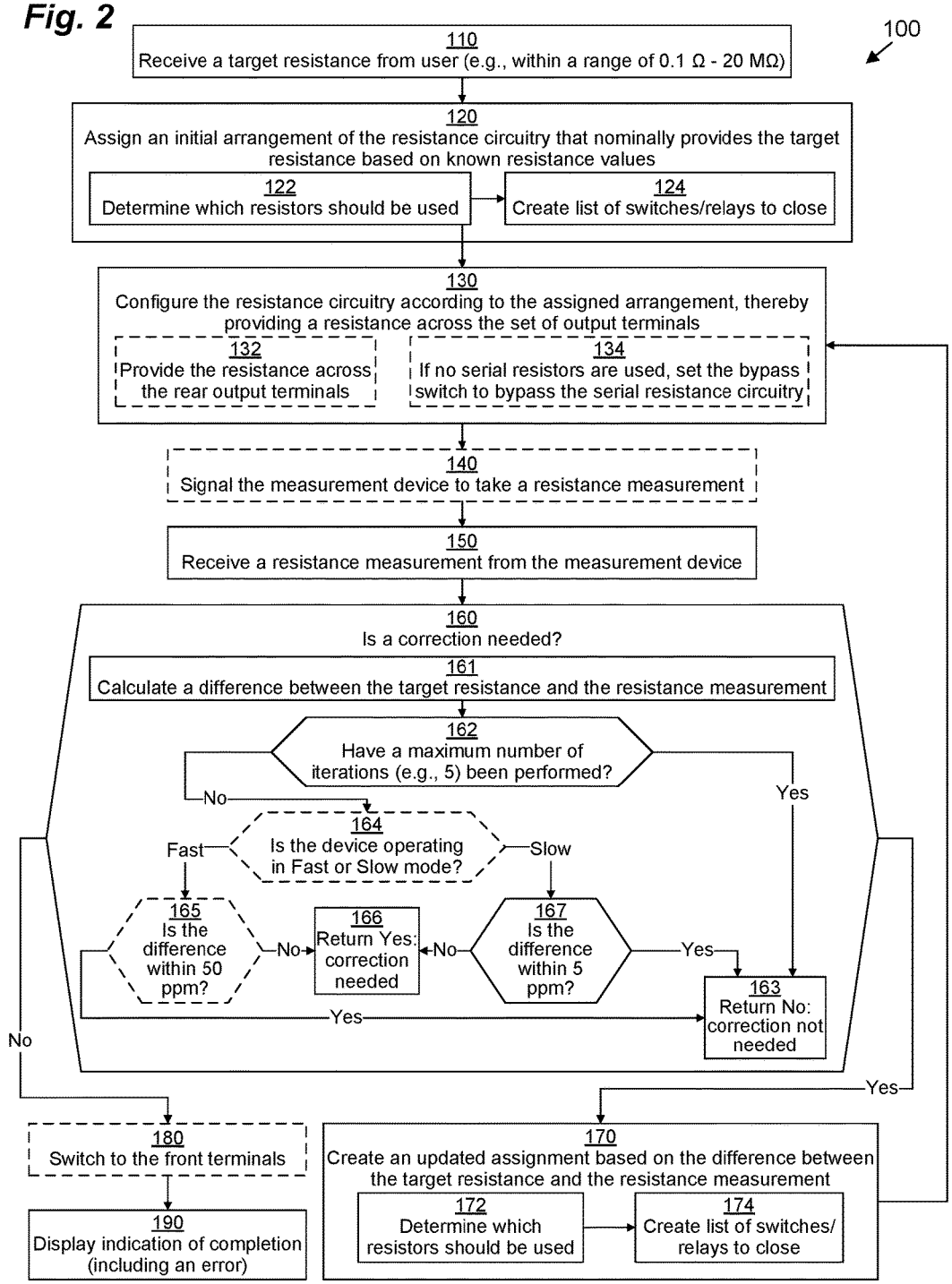
FIG. 2 is a flowchart depicting example methods of various embodiments for adjusting output resistance of a device to a target resistance using an external measurement device.

FIG. 2 illustrates an example method 100 performed by control means (e.g., control circuitry 42) for producing a resistance as instructed by a user 35 in accordance with various embodiments. It should be understood that any time a piece of software is described as performing a method, process, step, or function, in actuality what is meant is that a computing device (e.g., control circuitry 42, 42') on which that piece of software is running performs the method, process, step, or function when executing that piece of software on its processing circuitry 68. It should be understood that various steps and sub-steps (132, 134, 140, 164, 165, and 180) are depicted with dashed borders because they are optional or tangential to the method 100 as described. In addition, one or more of the remaining steps or sub-steps of method 100 may also be omitted in some embodiments. Similarly, in some embodiments, one or more steps or sub-steps may be combined together or performed in a different order. Method 100 is generally performed by system 30. However, in one embodiment (as primarily described), method 100 is entirely performed by DAVRG 32, while in another embodiment (not described in detail) method 100 is primarily performed by control device 33.

In step 110, control circuitry 42, 42' receives a value entered by the user 35 via UI 36, 36' and stores it as target resistance 72. In some embodiments, the user 35 types the target resistance 72 into display 64 using input circuitry 66 digit-by-digit. In some embodiments, UI 36, 36' is configured to receive inputs ranging between 0.100 000Ω and 20.000 000 MΩ. In one embodiment, UI 36, 36' is configured to receive a 6.5-digit value, while in another embodiment, UI 36, 36' is configured to receive a 7.5-digit value. In yet another embodiment, UI 36, 36' is configured to receive a 6.5-digit value when DAVRG 32 is configured to operate in a fast mode, but to instead receive a 7.5-digit value when DAVRG 32 is configured to operate in a slow mode. Thus, for example, when operating in slow mode, the user 35 may enter a value of 21.739 45 kΩ, which would then be stored as the target resistance 72.

Then, in step 120, control circuitry 42, 42' assigns an initial arrangement 74 of the resistance circuitry 44 that nominally provides the target resistance 72 based on the pre-stored resistance values. For example, in one embodiment, control circuitry 40, 40' determines which resistors 52 should be used (sub-step 122) and creates a bitmap that indicates which switches 54 should be closed and which should be open (sub-step 124), which makes up the initial arrangement 74. In the example above in which the user 35 input a target resistance of 21.739 45 kΩ, the initial arrangement 74 may indicate that series resistors 52s1, 52s3 (having respective resistances of Rs1=3.55 kΩ and Rs3=16.4 kΩ) as well as parallel resistors 52p15, 52p18, 52p19, 52p20, 52p22, 52p23, 52p25, 52p29, and 52p31 (having respective resistances of Rp15=2.23 kΩ, Rp18=17.0 kΩ, Rp19=33.3 kΩ, Rp20=66.0 kΩ, Rp22=258.0 kΩ, Rp23=506.0 kΩ, Rp25=2.0 MΩ, Rp29=30.0 MΩ, and Rp31=120.0 MΩ) should be used (i.e., indicating that only series switches 54s1, 54s3 should be open and that only parallel switches 54p15, 54p18, 54p19, 54p20, 54p22, 54p23, 54p25, 54p29, and 54p31 should be closed). This should nominally produce a resistance of 21.739 454 6 kΩ.

An example embodiment of how sub-step 122 is implemented is described below in connection with FIG. 3.

In step 130, control circuitry 42, 42' configures the resistance circuitry 44 according to the assigned arrangement (initially the initial arrangement 74, but later using an updated arrangement 78) by sending an instruction 82, 90 to the resistance circuitry 44. Upon resistance circuitry 44 receiving the instruction 82, 90, resistance circuitry 44 executes the instruction 82, 90 (e.g., by configuring the switches 54 as directed by the bitmap), thereby producing a test resistance. In one embodiment, at this point, the resistance is provided only across rear terminals 62 (sub-step 132), but not across the front terminals 60. In one embodiment, if the bitmap indicates that all of the series switches 54s are to be closed (i.e., none of the series resistors 52s are to be used), then resistance circuitry 44 may cause bypass switch 58 to bypass the series set 59 entirely. In another embodiment, control circuitry 42. 42' makes that decision and the position of bypass switch 58 is indicated within the bitmap of the instruction 82, 90.

In step 140, control circuitry 42, 42' signals the resistance measurement device 50 (e.g., by sending measurement command 84 across communications port 40, 40') to take a resistance measurement across the rear terminals 62. In some embodiments, this step may be omitted, e.g., if the resistance measurement device 50 is configured to continuously or periodically take measurements. In any case, the resistance measurement device 50 performs the resistance measurement 86, recording the actual resistance produced by DAVRG 32 as a recorded resistance measurement 88.

In step 150, the resistance measurement device 50 sends the recorded resistance measurement 88 back across communications port 40, 40' to the control circuitry 42, 42'.

In step 160, control circuitry 42, 42' determines whether or not a correction is needed. In some embodiments, step 160 is implemented by performing sub-steps 161-167.

In sub-step 161, control circuitry 42, 42' calculates the difference 76 between the target resistance 72 and the recorded resistance measurement 88. Thus, in one embodiment, control circuitry 42, 42' may subtract the recorded resistance measurement 88 from the target resistance 72. In such an embodiment, if the recorded resistance measurement 88 exceeds the target resistance 72, then the difference 76 will be negative, but if the target resistance 72 exceeds the recorded resistance measurement 88, then the difference 76 will be positive.

Then, in sub-step 162, control circuitry 42, 42' determines whether or not a maximum permitted number of iterations has already been performed. In one embodiment, up to five iterations may be performed. Once the maximum number of iterations iterations have been performed, sub-step 162 will return an affirmative result, proceeding to sub-step 163, in which it is determined that step 160 will return a negative response, no correction being needed. If, however, the maximum number of iterations have not (yet) been performed, sub-step 162 will return a negative result, proceeding to sub-step 164.

In some embodiments, sub-step 164 may be skipped, with operation proceeding directly to sub-step 167 (or, in other embodiments, directly to sub-step 165).

In sub-step 164, if DAVRG 32 is currently configured to operate in fast mode, control circuitry 42, 42' proceeds to sub-step 165, but if DAVRG 32 is currently configured to operate in slow mode, control circuitry 42, 42' instead proceeds to sub-step 167.

In sub-step 165, when DAVRG 32 is configured to operate in fast mode, control circuitry 42, 42' determines whether or not the calculated difference 76 (see sub-step 161) is within 50 ppm from the target resistance 72. If the difference 76 is within 50 ppm, then operation proceeds to sub-step 163, in which it is determined that step 160 will return a negative response, no correction being needed. If, however, the difference 76 is greater than 50 ppm compared to the target resistance 72, then operation instead proceeds to sub-step 166, in which it is determined that step 160 will return an affirmative response, a correction being needed.

In sub-step 167, when DAVRG 32 is configured to operate in slow mode, control circuitry 42, 42' determines whether or not the calculated difference 76 (see sub-step 161) is within 5 ppm from the target resistance 72. If the difference 76 is within 5 ppm, then operation proceeds to sub-step 163, in which it is determined that step 160 will return a negative response, no correction being needed. If, however, the difference 76 is greater than 5 ppm compared to the target resistance 72, then operation instead proceeds to sub-step 166, in which it is determined that step 160 will return an affirmative response, a correction being needed.

It should be understood that the 5 ppm and 50 ppm thresholds for steps 165 and 167 are examples only. In other embodiments, different specific thresholds may be used for the fast and slow modes, while in other embodiments, there may only be one operating mode or there may be more than two operating modes.

If step 160 yields a negative result (no correction being needed), then operation proceeds to step 180 or step 190. In step 180, control circuitry 42, 42' directs the resistance circuitry 44 to switch the resistance to be provided over the front terminals 60 instead of the rear terminals. However, in some embodiments, the resistance may always be provided over both the front terminals 60 and the rear terminals 62, step 180 being unnecessary. Finally, in step 190, control circuitry 42, 42' causes the UI 36, 36' to display an indication of completion. In some embodiments, control circuitry 42, 42' further causes the UI 36, 36' to display the error (e.g., the difference 76 divided by the target resistance 72, expressed in ppm).

If, however, step 160 yields an affirmative result (a correction being needed), then operation proceeds to step 170. In step 170, control circuitry 42, 42' assigns an updated arrangement 78 of the resistance circuitry 44 that is expected to provide the target resistance 72 based on the pre-stored resistance values as well as on the difference 76. For example, in one embodiment, control circuitry 40, 40' determines which resistors 52 should be used with correction due to the difference 76 (sub-step 172, which is similar to sub-step 122 except for the correction) and creates a bitmap that indicates which switches 54 should be closed and which should be open (sub-step 174, which is similar to sub-step 124), which makes up the updated arrangement 78.

An example embodiment of how sub-step 172 is implemented is described below in connection with FIG. 3. For example, the difference 76 may be added to the target resistance 72 prior to calculating the updated arrangement based on the sum.

Once the updated arrangement 78 is created, operation returns back to step 130, in which the updated arrangement 78 is sent to the resistance circuitry 44 in updated instruction 90. Operation then proceeds as before, except the number of iterations is incremented.

FIG. 3 illustrates an example method 200 performed by control circuitry 42, 42' for implementing sub-steps 122 and 172 in accordance with various embodiments. It should be understood that one or more of the steps or sub-steps of method 200 may be omitted in some embodiments. Similarly, in some embodiments, one or more steps or sub-steps may be combined together or performed in a different order. Method 200 implements both sub-steps 122 and 172.

In step 210, which is omitted when implementing sub-step 122 (i.e., in the first iteration), control circuitry 42, 42' adds the difference 76 to the target resistance 72 to yield a corrected target resistance. This corrected target resistance is used throughout the remainder of method 200 in place of the target resistance 72. In the third and subsequent iterations, the difference 76 may be added to the previously corrected target resistance (from operation of method 200 in connection with the previous iteration) instead of being added to the target resistance 72.

In the example above in which the user 35 had input a target resistance of 21.739 45 kΩ, let us assume that the recorded resistance measurement 88 was 21.739 80 kΩ in step 150 of the first iteration. Then, the difference 76 would be 21.739 45 kΩminus 21.739 80 kΩ or −0.35Ω (which represents an error of 16.1 ppm). Thus, in step 210 when implementing sub-step 172 as part of the second iteration, the corrected target resistance would be 21.739 45 kΩplus −0.35Ω or 21.739 10 kΩ.

Let us further assume that subsequently the recorded resistance measurement 88 was 21.739 61 kΩ in step 150 of the second iteration. Then, the difference 76 would be 21.739 45 kΩminus 21.739 61 kΩ or −0.16Ω (which represents an error of 7.4 ppm). Thus, in step 210 when implementing sub-step 172 as part of the third iteration, the corrected target resistance would be 21.739 10 kΩplus −0.16Ω or 21.738 94 kΩ.

In step 220, if the DAVRG 32 is operating in 2-terminal mode (i.e., the DUT 31 is connected to the DAVRG 32 using only two front terminals 62 rather than using a four terminal Kelvin connection), then control circuitry 42, 42' (further) corrects the target resistance 72 by subtracting a pre-calibrated trace resistance (e.g., due to the resistance of traces 57 and various other traces 53, etc.) for purposes of method 200.

Then, in step 230, control circuitry 42, 42' assigns a subset (which may be a null subset) of the set 59 of series resistors 52s to be used in generating the target resistance 72. Step 230 results in the largest resistance less than the target resistance 72 that can be created by running each series resistor 52s no more than once in series. In some embodiments, step 230 is implemented by performing sub-steps 232-236.

In sub-step 232, control circuitry 42, 42' subtracts a current assigned series resistance value (initially set to zero) from the target resistance 72. Initially, on a first pass, sub-step 232 will yield the target resistance 72.

Then, in sub-step 234, control circuitry 42, 42' determines whether or not the difference calculated in sub-step 232 is smaller than the resistance Rs of the lowest-valued series resistor 52s that has not yet been assigned to the subset of the set 59 of series resistors 52s. If sub-step 234 yields an affirmative value, then no remaining series resistors 52s may be added to the subset of the set 59 of series resistors 52s, and operation proceeds with step 240. Otherwise, if sub-step 234 yields a negative value, then operation proceeds with sub-step 236.

In sub-step 236, control circuitry 42, 42' finds the highest-valued series resistor 52s that has not yet been assigned to the subset of the set 59 of series resistors 52s whose resistance is less than the difference computed in sub-step 232. That highest-valued series resistor 52sX is then assigned to the subset of the set 59 of series resistors 52s. In addition, the resistance RsX of that resistor is added to the current assigned series resistance (which was initially set to zero). Operation then returns back to sub-step 232.

In the example above in which the user 35 had input a target resistance of 21.739 45 kΩ, step 230 assigns series resistor 52s3 having a resistance of 16.4 kΩ to the subset of the set 59 of series resistors 52s, since 16.4 kΩ is the highest series resistance Rs less than the target resistance of 21.739 45 kΩ(sub-step 236). After subtracting 16.4 kΩ from 21.739 45 kΩ to yield 5.339 45 kΩ (sub-step 232 on a second pass), the highest remaining series resistance Rs less that value is Rs1=3.55 kΩ(sub-steps 234 and 236), so series resistor 52s1 having a resistance of 3.55 kΩ is also assigned to the subset of the set 59 of series resistors 52s (sub-step 236). However, after subtracting 3.55 kΩ from 5.339 45 kΩ (sub-step 232 on a third pass), the difference is only 1.789 45 kΩ, which is smaller than any of the unassigned series resistances Rs (sub-step 234), so step 230 terminates after assigning series resistor 52s1, 52s3 to the subset of the set 59 of series resistors 52s.

After step 230, in step 240, control circuitry 42, 42' assigns a subset (which, in the case of step 240 cannot be a null subset) of the set 51 of parallel resistors 52p to be used in generating the target resistance 72 when arranged in series with the assigned series resistors 52s, unless no series resistors 52s are used at all, in which case bypass switch 58 ensures that the subset of the parallel set 51 is connected directly to the high connector 56(b) without passing through the series set 59 at all. Step 240 finds the closest parallel resistance achievable by running any of the parallel resistors 52p in parallel with each other to the final difference computed by sub-step 232. Thus, in the example above in which the user 35 input a target resistance of 21.739 45 kΩ, since the final difference from step 232 was 1.789 45 kΩ, then step 240 finds the closest parallel resistance achievable by running any of the parallel resistors 52p in parallel with each other to 1.789 45 kΩ and assigns those parallel resistors 52p to the subset of the set 51 of parallel resistors 52p. In some embodiments, step 240 is implemented by performing sub-steps 242-246.

In sub-step 242, control circuitry 42, 42' finds the lowest-valued parallel resistor 52p whose resistance RpX is greater than or equal to the difference computed in the last run of sub-step 232. That lowest-valued series resistor 52pX is then assigned to the subset of the set 51 of parallel resistors 52p. In addition, the resistance RpX of that resistor is used as an initial assigned parallel resistance. Operation then proceeds with sub-step 244.

In sub-step 244, control circuitry 42, 42' finds the next-largest-valued parallel resistor 52p that has not yet been assigned to the subset of the set 51 of parallel resistors 52p whose resistance RpY, when placed in parallel with the current assigned parallel resistance, yields a combined resistance that is greater than or equal to the difference computed in the last run of sub-step 232. That next-largest-valued series resistor 52pY is then assigned to the subset of the set 51 of parallel resistors 52p. In addition, the calculated combined resistance is used as the new current assigned parallel resistance.

If there are any remaining parallel resistors 52p with higher resistances than RpY that have not yet been tested, then sub-step 244 repeats. Otherwise, operation proceeds with step 246, in which the assignment process ends using the subsets assigned in steps 230 and 240.

In the example above in which the user 35 had input a target resistance of 21.739 45 kΩ, recall that the difference from the last performance of sub-step 234 was 1.789 45 kΩ. Thus, step 240 first assigns resistor 52p15 having a resistance Rp15 of 2.23 kΩ to the subset of the set 51 of parallel resistors 52p, since 2.23 kΩ is the lowest parallel resistance Rp higher than the difference of 1.789 45 kΩ (sub-step 242). Sub-step 244 then operates to further assign resistor 52p18 having a resistance Rp18 of 17.0 kΩ to the subset of the set 51 of parallel resistors 52p, since a parallel combination of Rp15 with either Rp16 or Rp17 would be less than the difference of 1.789 45 kΩ, but a parallel combination of Rp15 with Rp18 yields a new assigned parallel resistance of 1.971 39 kΩ, which is greater than the difference of 1.789 45 kΩ. Sub-step 242 then repeats, adding resistors 52p19, 52p20, 52p22, 52p23, 52p25, 52p29, and 52p31 before running out of parallel resistors 52p. At that point, the assigned parallel resistance is 1.789 454 6 kΩ, which is quite close to the difference of 1.789 45 kΩ (within 1 ppm).

Thus, techniques have been presented for implementing a resistance box (e.g., DAVRG 32) having a high degree of precision (i.e., at least 6 digits) across an entire wide operable range (e.g., ranging from 0.100 000Ω to 20.000 000 MΩ) with extremely-high accuracy, such as, for example, 5 ppm. This may be accomplished through the use of both serially-arranged resistors 52s and parallel-arranged resistors 52p that may be dynamically controlled by a computerized device 42, 42' to select a best combination of resistors 52 to generate a user-input resistance 72 (input using a 6.5 or 7.5 digit UI 36, 36'). Accuracy is ensured by a constant connection to a digital multimeter (or other high accuracy resistance measurement device 50) that allows the selection of resistors 52 to be iteratively altered based on live resistance calibration.

As used throughout this document, the words "comprising," "including," "containing," and "having" are intended to set forth certain items, steps, elements, or aspects of something in an open-ended fashion. Also, as used herein and unless a specific statement is made to the contrary, the word "set" means one or more of something. This is the case regardless of whether the phrase "set of" is followed by a singular or plural object and regardless of whether it is conjugated with a singular or plural verb. Further, although ordinal expressions, such as "first," "second," "third," and so on, may be used as adjectives herein, such ordinal expressions are used for identification purposes and, unless specifically indicated, are not intended to imply any ordering or sequence. Thus, for example, a "second" event may take place before or after a "first event," or even if no first event ever occurs. In addition, an identification herein of a particular element, feature, or act as being a "first" such element, feature, or act should not be construed as requiring that there must also be a "second" or other such element, feature or act. Rather, the "first" item may be the only one. Although certain embodiments are disclosed herein, it is understood that these are provided by way of example only and that the invention is not limited to these particular embodiments.

While various embodiments have been particularly shown and described, it will be understood by those skilled in the art that various changes in form and details may be made therein without departing from the spirit and scope of the appended claims.

For example, although various embodiments have been described as being methods, software embodying these methods is also included. Thus, one embodiment includes a tangible non-transitory computer-readable storage medium (such as, for example, a hard disk, a floppy disk, an optical disk, flash memory, etc.) programmed with instructions, which, when performed by a computer or a set of computers, cause one or more of the methods described in various embodiments to be performed. Another embodiment includes a computer that is programmed to perform one or more of the methods described in various embodiments.

Furthermore, it should be understood that all embodiments which have been described may be combined in all possible combinations with each other, except to the extent that such combinations have been explicitly excluded.

Finally, even if a technique, method, apparatus, or other concept is specifically labeled as "conventional," Applicant makes no admission that such technique, method, apparatus, or other concept is actually prior art under 35 U.S.C. § 102 or 35 U.S.C. § 103, such determination being a legal determination that depends upon many factors, not all of which are known to Applicant at this time.

What is claimed is:

1. An apparatus comprising:
    resistance circuitry having a plurality of resistors in a dynamically-configurable arrangement;
    a user interface including input circuitry;
    a set of output terminals configured to provide an electrical signal to a measurement device;
    a communications port configured to communicate with the measurement device; and
    control circuitry, the control circuitry being constructed and arranged to:
        receive a target resistance from a user via the input circuitry;
        assign a first arrangement of the resistance circuitry that nominally provides the target resistance based on known resistance values of the plurality of resistors;

configure the resistance circuitry according to the assigned first arrangement, thereby providing a first resistance across the set of output terminals;

subsequently, receive a resistance measurement from the measurement device via the communications port;

in response to receiving the resistance measurement, assign a second arrangement of the resistance circuitry based on a difference between the target resistance and the resistance measurement; and configure the resistance circuitry according to the assigned second arrangement, thereby providing a second resistance across the set of output terminals, the second resistance being closer to the target resistance than was the first resistance.

2. The apparatus of claim 1 wherein:

the resistance circuitry includes a first set of resistors arranged in parallel with each other and a second set of resistors arranged in series with each other, the first set being arranged in series with the second set;

each resistor of the first set is arranged in series with a respective switch;

each resistor of the second set is arranged in parallel with a respective switch;

the first arrangement indicates whether or not each respective switch is open or closed; and the second arrangement indicates whether or not each respective switch is open or closed.

3. The apparatus of claim 2 wherein the resistance circuitry further includes a bypass switch, the bypass switch causing the second set of resistors to be bypassed when the respective switch for each resistor of the second set is closed.

4. The apparatus of claim 2 wherein a subset of the first set is further arranged with one or more additional switches in parallel with the respective switch, each switch being a low-resistance multi-pole relay.

5. The apparatus of claim 2 wherein assigning the first arrangement includes:

assigning the respective switches of a subset of the resistors of the second set to be open, pre-stored effective resistance values of the subset of the second set summing to a nominal series resistance value as large as possible without exceeding the target resistance; and assigning the respective switches of a subset of the resistors of the first set to be closed, pre-stored effective resistance values of the subset of the first set yielding a combined nominal parallel resistance value, which, when added to the nominal series resistance value, is as close as possible to the target resistance.

6. The apparatus of claim 5 wherein assigning the second arrangement includes offsetting the target resistance by the difference prior to reassigning the respective switches of a new subset of the resistors of the second set to be closed and reassigning the respective switches of a new subset of the resistors of the first set to be closed.

7. The apparatus of claim 2 wherein the first set of resistors is arranged using a star circuit configuration, traces connecting to each resistor of the first set of resistors having resistance contributions to circuit resistance independent of each other.

8. The apparatus of claim 2 wherein the input circuitry is configured to receive, as the target resistance from the user, a value between 0.100000Ω and 20.000000 MΩ.

9. The apparatus of claim 8 wherein the resistance circuitry is configured to provide any user-input target resistance to within 5 ppm.

10. The apparatus of claim 9 wherein the first set of resistors includes a plurality of resistors having resistance values exceeding 20 MΩ.

11. The apparatus of claim 1 wherein:

the set of output terminals includes:

a first subset of output terminals configured to connect to the measurement device; and a second subset of output terminals configured to connect to a device under test;

the first resistance is provided across the first subset to the exclusion of the second subset; and the second resistance is provided across the second subset.

12. The apparatus of claim 11 wherein the first subset of output terminals includes four terminals arranged in a Kelvin connection configuration.

13. The apparatus of claim 12 wherein the second subset of output terminals also includes four terminals arranged in a Kelvin connection configuration.

14. The apparatus of claim 1 wherein the control circuitry is further constructed and arranged to iteratively assign additional arrangements and configure the resistance circuitry according to the assigned additional arrangements, correcting for updated measurements from the measurement device.

15. The apparatus of claim 1 wherein the control circuitry is further constructed and arranged to iteratively assign additional arrangements and configure the resistance circuitry according to the assigned additional arrangements, correcting for updated measurements from the measurement device, until a resistance across the set of output terminals is within 5 ppm of the user-input target resistance.

16. The apparatus of claim 1 wherein the control circuitry is further constructed and arranged to iteratively assign additional arrangements and configure the resistance circuitry according to the assigned additional arrangements, correcting for updated measurements from the measurement device, up to a maximum permitted number of iterations.

17. A method of providing a user-selected target resistance across a set of output terminals of a resistance-generating apparatus, the method comprising:

assigning a first arrangement of resistance circuitry of the resistance-generating apparatus that nominally provides the target resistance based on known resistance values of a plurality of resistors of the resistance circuitry;

configuring the resistance circuitry according to the assigned first arrangement, thereby providing a first resistance across the set of output terminals;

subsequently, receiving a resistance measurement from a measurement device configured to measure the first resistance across the set of output terminals;

in response to receiving the resistance measurement, assigning a second arrangement of the resistance circuitry based on a difference between the target resistance and the resistance measurement; and configuring the resistance circuitry according to the assigned second arrangement, thereby providing a second resistance across the set of output terminals, the second resistance being closer to the target resistance than was the first resistance.

18. A system comprising:

resistance circuitry having a plurality of resistors in a dynamically-configurable arrangement;

user interface means for interfacing with a user;
a measurement device;
a set of output terminals configured to provide an electrical signal to the measurement device;
a communications port configured to communicate with the measurement device; and
control means, the control means being constructed and arranged to:
receive a target resistance from the user via the user interface means;
assign a first arrangement of the resistance circuitry that nominally provides the target resistance based on known resistance values of the plurality of resistors;
configure the resistance circuitry according to the assigned first arrangement, thereby providing a first resistance across the set of output terminals;
subsequently, receive a resistance measurement from the measurement device via the communications port;
in response to receiving the resistance measurement, assign a second arrangement of the resistance circuitry based on a difference between the target resistance and the resistance measurement; and
configure the resistance circuitry according to the assigned second arrangement, thereby providing a second resistance across the set of output terminals, the second resistance being closer to the target resistance than was the first resistance.

19. The system of claim 18 wherein:
the user interface means, the communications port, and the control means are housed in a first apparatus physically-removed from the measurement device;
the resistance circuitry and the set of output terminals are housed in a second apparatus physically-removed from both the first apparatus and the measurement device; and
a communications link connects the first apparatus to the second apparatus to allow the control means to configure the resistance circuitry.

20. The system of claim 18 wherein the measurement device is a digital multimeter configured to provide resistance measurements to at least 7.5 digits of precision.

* * * * *